(12) United States Patent
Patil et al.

(10) Patent No.: US 11,784,151 B2
(45) Date of Patent: Oct. 10, 2023

(54) REDISTRIBUTION LAYER CONNECTION

(71) Applicant: QUALCOMM Incorporated, San Diego, CA (US)

(72) Inventors: Aniket Patil, San Diego, CA (US); Hong Bok We, San Diego, CA (US); Marcus Hsu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/936,263

(22) Filed: Jul. 22, 2020

(65) Prior Publication Data
US 2022/0028816 A1 Jan. 27, 2022

(51) Int. Cl.
*H01L 23/00* (2006.01)

(52) U.S. Cl.
CPC .............. *H01L 24/20* (2013.01); *H01L 24/19* (2013.01); *H01L 2224/2101* (2013.01); *H01L 2924/01029* (2013.01); *H01L 2924/30101* (2013.01)

(58) Field of Classification Search
CPC . H01L 24/20; H01L 24/19; H01L 2224/2101; H01L 2924/01029; H01L 2924/30101
See application file for complete search history.

(56) References Cited

U.S. PATENT DOCUMENTS

| | | | |
|---|---|---|---|
| 2008/0185724 A1* | 8/2008 | Tseng | H01L 23/53223 257/762 |
| 2010/0044845 A1 | 2/2010 | Funaya et al. | |
| 2014/0217604 A1* | 8/2014 | Chou | H01L 24/81 257/774 |
| 2017/0062383 A1* | 3/2017 | Yee | H01L 25/0655 |
| 2019/0148330 A1* | 5/2019 | Chen | H01L 21/6835 257/774 |
| 2019/0206916 A1* | 7/2019 | Lin | H01L 24/09 |
| 2021/0043570 A1* | 2/2021 | Ganesan | H01L 21/565 |
| 2021/0183842 A1* | 6/2021 | Fay | H01L 25/50 |
| 2021/0242166 A1* | 8/2021 | Huang | H01L 24/32 |
| 2021/0296249 A1* | 9/2021 | Khim | H01L 21/4853 |

OTHER PUBLICATIONS

International Search Report and Written Opinion—PCT/US2021/03821—ISA/EPO—dated Nov. 24, 2021.
Partial International Search Report—PCT/US2021/038216—ISA/EPO—dated Oct. 1, 2021.

* cited by examiner

*Primary Examiner* — Fernando L Toledo
*Assistant Examiner* — Neil R Prasad
(74) *Attorney, Agent, or Firm* — Muncy, Geissler, Olds & Lowe, P.C.

(57) ABSTRACT

Examples herein include die to metallization structure connections that eliminate the solder joint to reduce the resistance and noise on the connection. In one example, a first die is attached to a metallization layer by a plurality of copper interconnections and a second is attached to the metallization layer opposite the first die through another plurality of copper interconnections. In this example, the copper interconnects may connect the respective die to a metallization structure in the metallization layer.

30 Claims, 10 Drawing Sheets

REDISTRIBUTION LAYER CONNECTION

FIELD OF DISCLOSURE

This disclosure relates generally to a metallization structure connection, and more specifically, but not exclusively, to die to metallization structure connections.

BACKGROUND

Unlike general purpose processors, specific purpose high speed application processors are used for specific applications. However, specific purpose high speed application processors need smaller interconnect paths for die to die circuitry than general purpose processors. All current packaging solutions use at least one solder joint for two dice facing each other attached on opposite sides of a substrate or metallization layer. The solder joint for the copper circuit introduces some resistance and noise to a high speed system. This circuit becomes more sensitive for thin layer packages with metallization structures (e.g., a redistribution layer, metallization structure). This is a deficiency in conventional approaches that will benefit from approaches to mitigate this noise for such packages supporting high speed die to die communication with each other.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a package comprises: a metallization layer; a first die electrically coupled to a first side of the metallization layer; a second die electrically coupled to a second side of the metallization layer opposite the first side of the metallization layer; a first plurality of copper interconnections between the first die and the metallization layer; and a second plurality of copper interconnections between the second die and the metallization layer.

In another aspect, a package comprises: a metallization layer; a first die electrically coupled to a first side of the metallization layer; a second die electrically coupled to a second side of the metallization layer opposite the first side of the metallization layer; first means for interconnection between the first die and the metallization layer; and second means for interconnection between the second die and the metallization layer.

In still another aspect, a method for manufacturing a package, the method comprises: forming a metallization layer; forming a first plurality of copper interconnections on a first side of the metallization layer; forming a second plurality of copper interconnections on a second side of the metallization layer opposite the first side of the metallization layer; electrically coupling a first die to the first plurality of copper interconnections; and electrically coupling a second die to the second plurality of copper interconnections.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
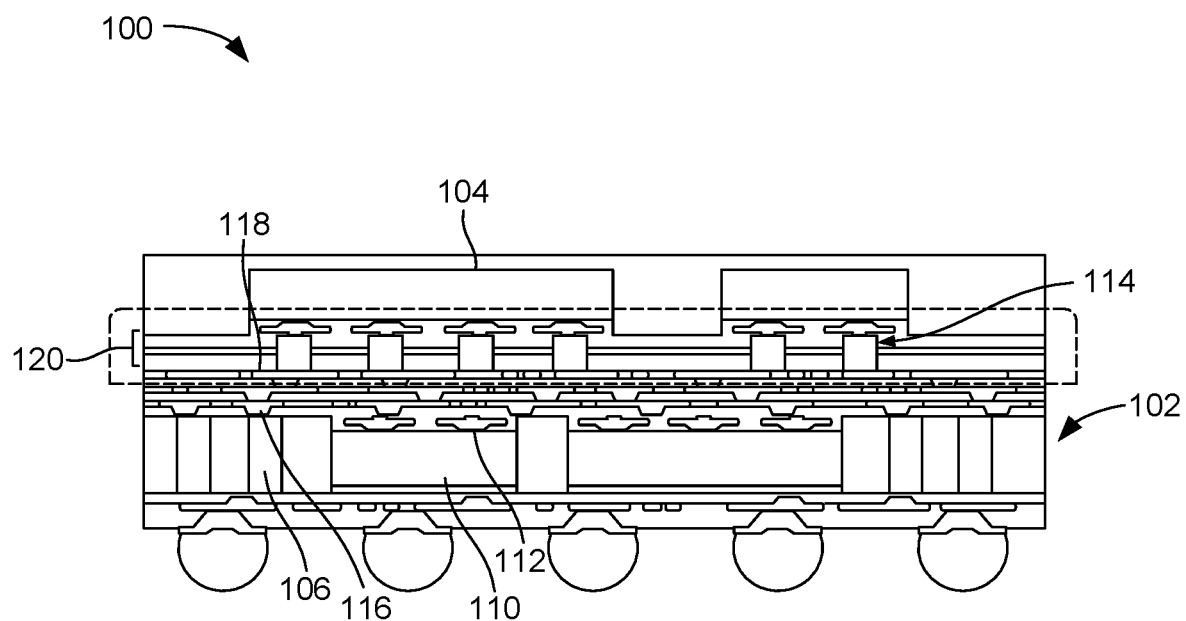
FIG. 1 illustrates an exemplary package in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs. Examples herein include L1 interconnections (e.g., die to metallization layer or die package layer connections) in multi-chip-modules (MCMs) such as from die bumps to module pins through package layers and between bumps of multiple dice through package layers that provide a shorter and more uniform path for these interconnections. In some examples, the interconnections are without solder joints or material, such as copper pillars, that provide a connection with less resistance and noise than a conventional solder based connection. As used herein, the metallization structures may include metal layers, vias, pads, or traces with dielectric between. As used herein, the metallization structures (e.g., first metallization structure and second metallization structure) may be a redistribution layer (RDL).

FIG. 1 illustrates an exemplary package in accordance with some examples of the disclosure. As shown in FIG. 1, a package 100 (i.e., an integrated device, semiconductor device, integrated circuit, die, interposer, package or package-on-package (PoP) etc.) may include a metallization layer 102, a first die 110 electrically coupled to a first side of the metallization layer 102, a second die 104 electrically coupled to a second side of the metallization layer 102, a first plurality of copper interconnections 112 between the first die 110 and the metallization layer 102; and a second plurality of copper interconnections 114 between the second die 104 and the metallization layer 102. The package 100 may also include a first metallization structure 116 in the metallization layer 102 wherein the first plurality of copper interconnections 112 are connected to the first metallization structure 116; a second metallization structure 118 in the metallization layer 102 wherein the second plurality of copper interconnections 114 are connected to the second metallization structure 118; and the first metallization structure 116 is coupled to the second metallization structure 118 and may comprise one of copper, silver, gold, or similar metals. In addition, the first plurality of copper interconnections 112 may comprise at least one copper die bump be coupled to at least one copper pillar 106, the second plurality of interconnections 114 may comprise a pillar formed with a copper to copper diffusion bond, the package 100 may also include a dielectric layer 120 between the second die 104 and the metallization layer 102 wherein the dielectric layer 120 may comprise an oxide covalent bond. Optionally, the package 100 may be incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

Figure 2A:
FIGS. 2A-M illustrates an exemplary partial method for manufacturing a first portion of a package in accordance with some examples of the disclosure.
Figure 2B:
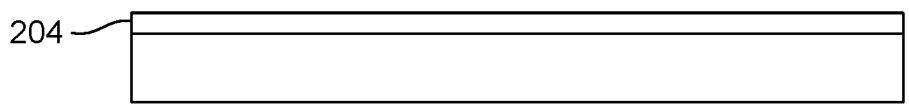
Figure 2C:
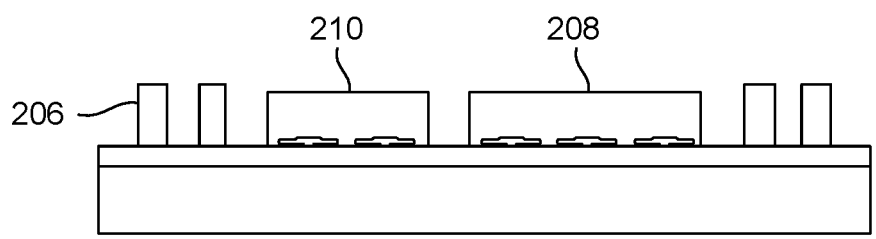
Figure 2D:
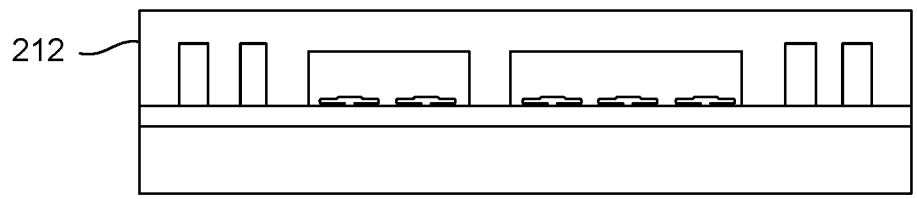
Figure 2E:
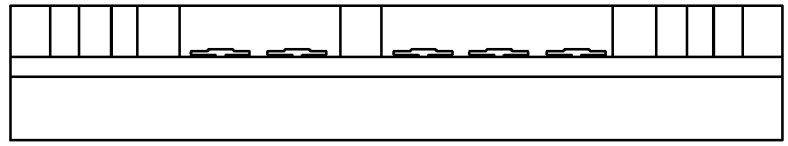

FIGS. 2A-M illustrates an exemplary partial method for manufacturing a first portion of a package in accordance with some examples of the disclosure. As shown in FIG. 2A, a partial method 200 for manufacturing a first portion of a package may begin with providing a first carrier 202. As shown in FIG. 2B, the partial method 200 may continue with applying a first adhesive coat 204 to the first carrier 202. As shown in FIG. 2C, the partial method 200 may continue with plating a plurality of pillars 206 (e.g., copper plated pillars), electrically coupling a third die 208 and a first die 210 between the plurality of pillars 206. As shown in FIG. 2D, the partial method 200 may continue with applying a mold compound 212 to encapsulate the plurality of pillars 206, the third die 208, and the first die 210. As shown in FIG. 2E, the partial method 200 may continue with back grinding to reveal the plurality of pillars 206.

Figure 2F:
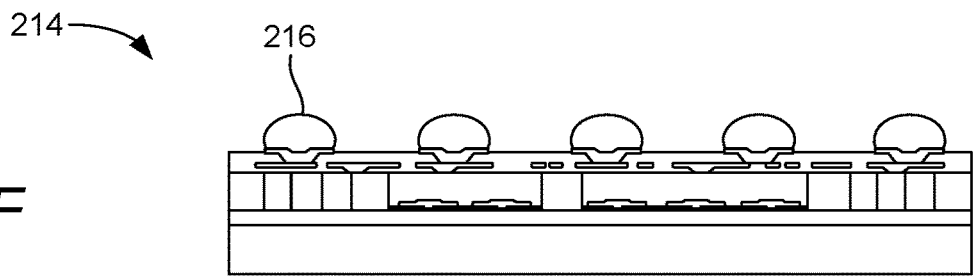
Figure 2G:
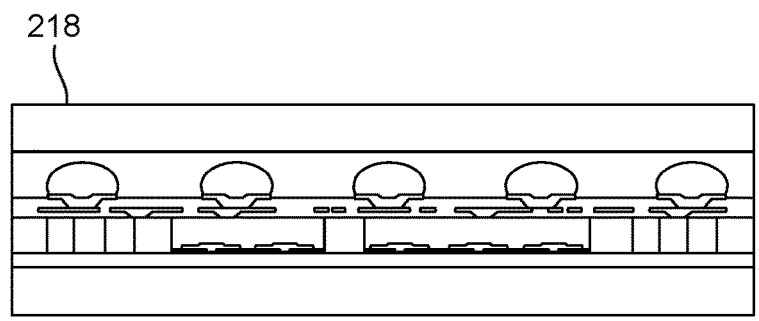
Figure 2H:
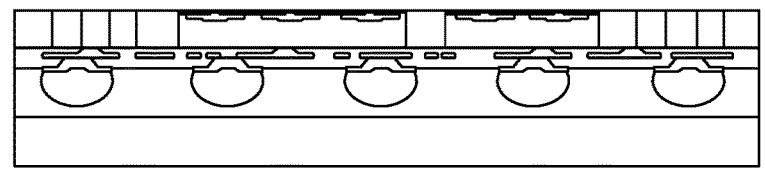
Figure 2I:
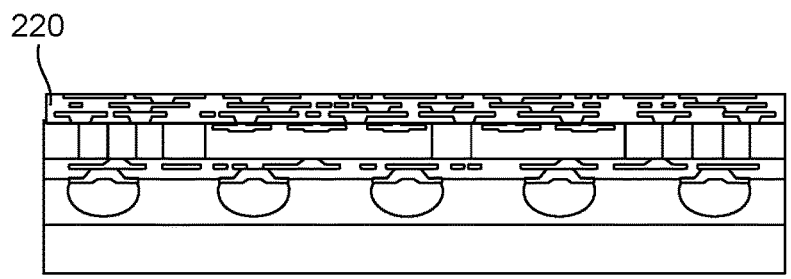

The partial method 200 may continue as shown in FIG. 2F with forming a third metallization structure 214, such as by building-up using a photo-imageable dielectric (PID) [PID coat+PID expose+develop+seed deposit+metallization structure/Under bump metal (UBM) (Lithograph+Plate+strip+etch)] in addition to attaching solder balls 216 to the third metallization structure 214. As shown in FIG. 2G, the partial method 200 may continue with attaching a second carrier 218. As shown in FIG. 2H, the partial method 200 may continue with removing the first carrier 202 and flipping the work piece. As shown in FIG. 2I, the partial method 200 may continue with forming a first metallization structure 220.

Figure 2J:
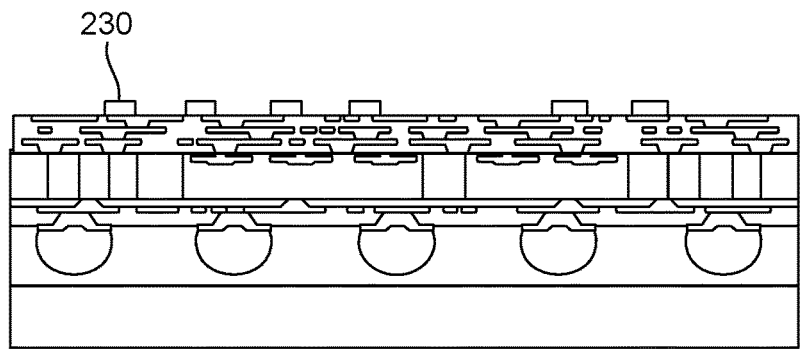
Figure 2K:
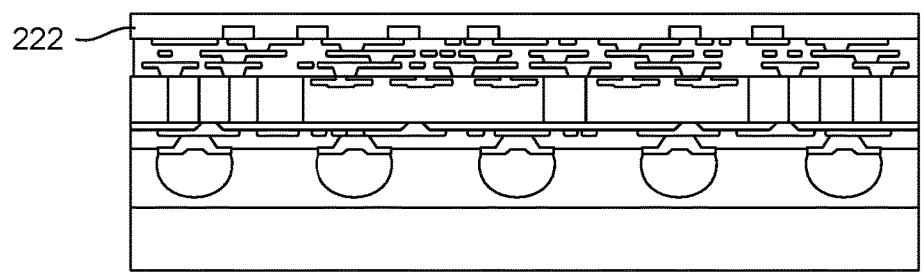
Figure 2L:
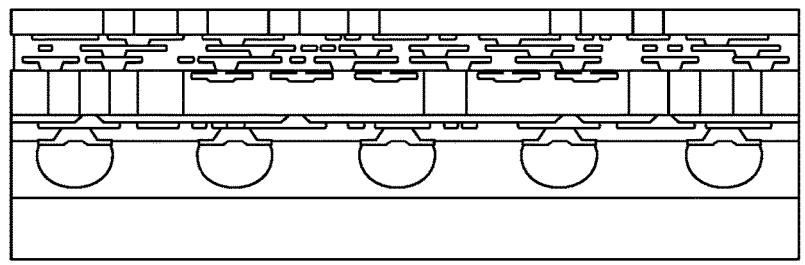
Figure 2M:
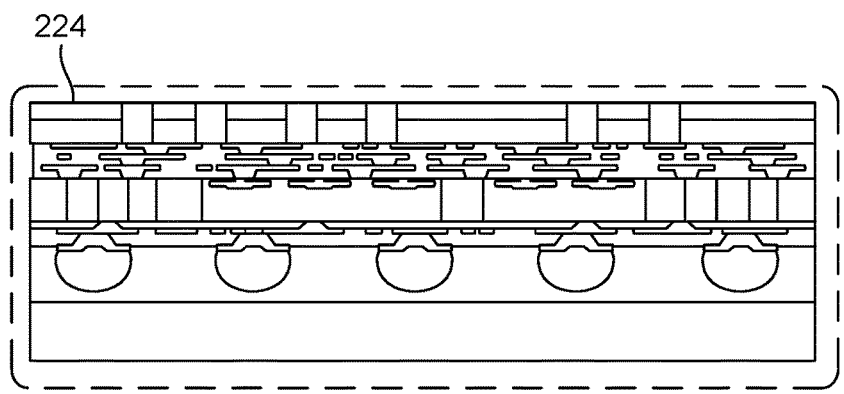

As shown in FIG. 2J, the partial method 200 may continue with forming a first plurality of interconnections 230, such as by plating copper pillars. As shown in FIG. 2K, the partial method 200 may continue with applying a PID 222. As shown in FIG. 2L, the partial method 200 may continue with back grinding and polishing for a planar surface. As shown in FIG. 2M, the partial method 200 may conclude with applying an oxide 224, such as by Physical Vapor Deposition (PVD) and/or Chemical Vapor Deposition (CVD).

Figure 3A:
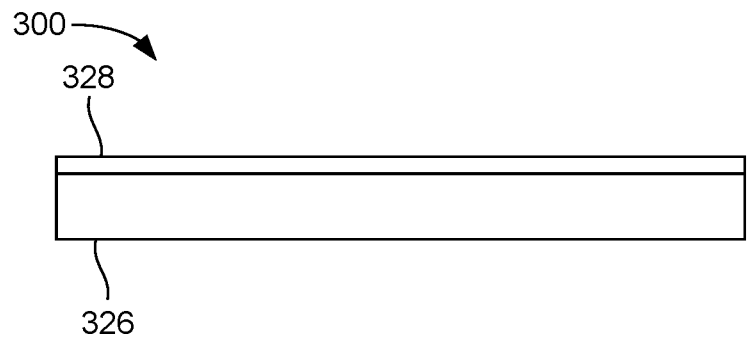
FIGS. 3A-I illustrates an exemplary partial method for manufacturing a second portion of a package in accordance with some examples of the disclosure.
Figure 3B:
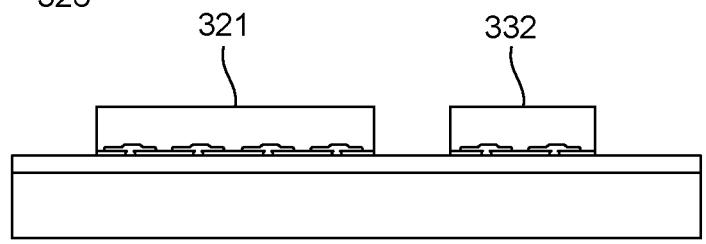
Figure 3C:
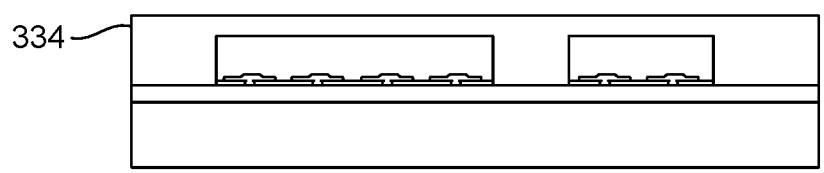
Figure 3D:
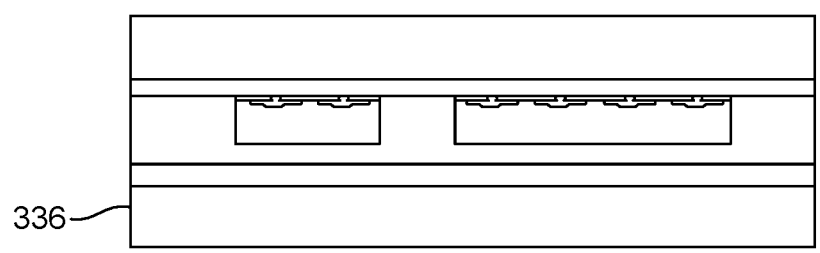
Figure 3E:
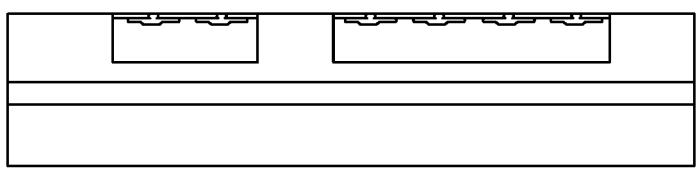

FIGS. 3A-I illustrates an exemplary partial method for manufacturing a second portion of a package in accordance with some examples of the disclosure. As shown in FIG. 3A, a partial method 300 for manufacturing a second portion of a package may begin with providing a third carrier 326 and applying a second adhesive coat 328. As shown in FIG. 3B, the partial method 300 may continue with electrically coupling a fourth die 332 and a second die 321. As shown in FIG. 3C, the partial method 300 may continue with applying a mold compound 334 and back grinding to planarize the surface. As shown in FIG. 3D, the partial method 300 may continue with attaching a fourth carrier 336 and flipping the work piece. As shown in FIG. 3E, the partial method 300 may continue with removing the third carrier 326.

Figure 3F:
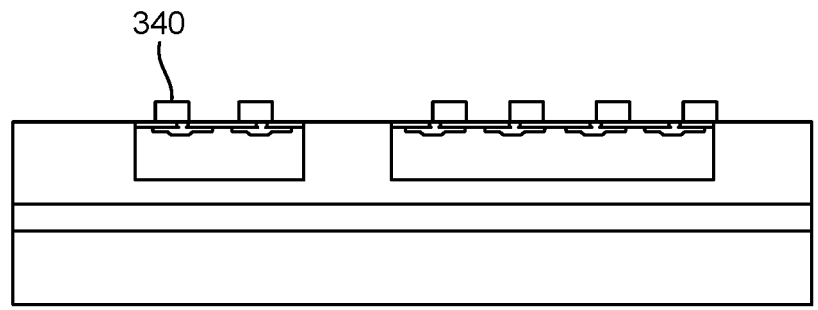
Figure 3G:
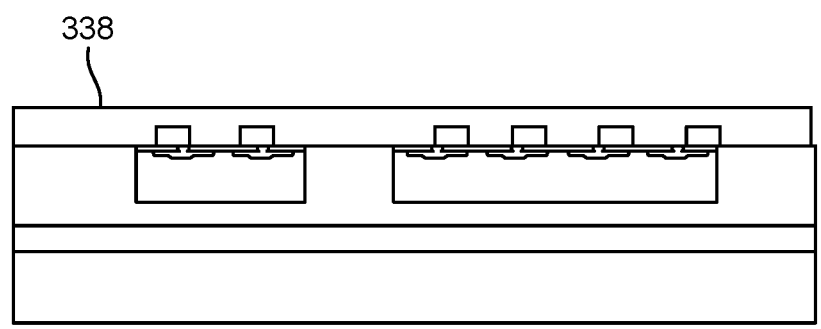
Figure 3H:
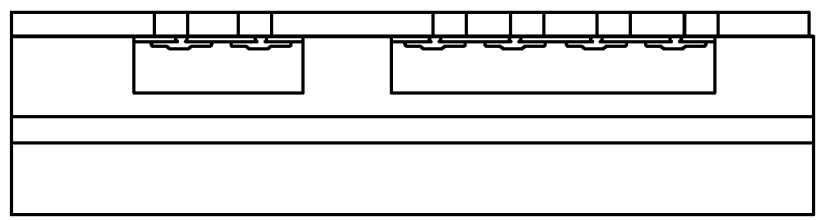
Figure 3I:
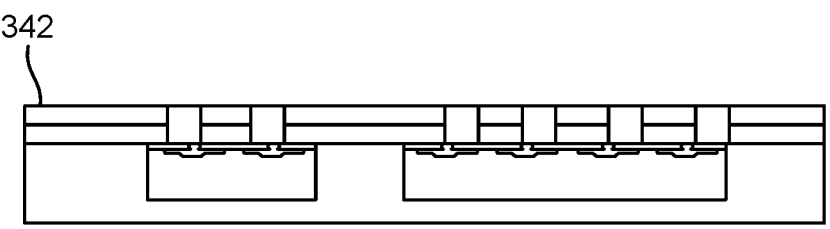

The partial method 300 may continue as shown in FIG. 3F with forming a second plurality of interconnections 340, such as by plating copper pillars. As shown in FIG. 3G, the partial method 300 may continue with applying a second PID 338. As shown in FIG. 3H, the partial method 300 may continue with back grinding and polishing for a planar surface. As shown in FIG. 3I, the partial method 300 may conclude with applying a second oxide 342, such as by PVD and/or CVD.

Figure 4A:
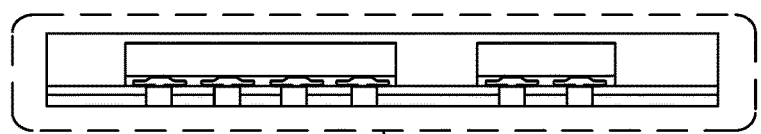
FIGS. 4A-C illustrates an exemplary partial method for manufacturing a package in accordance with some examples of the disclosure.
Figure 4B:
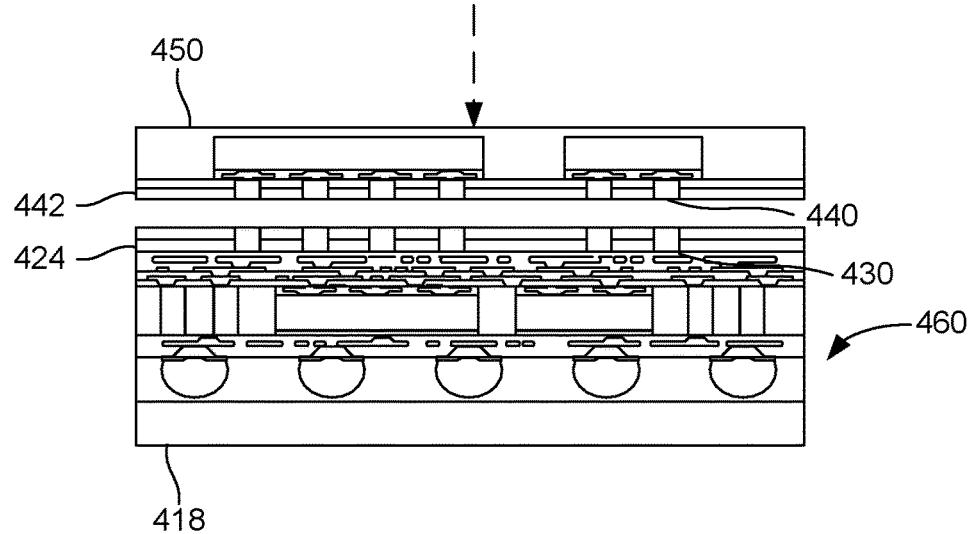
Figure 4C:
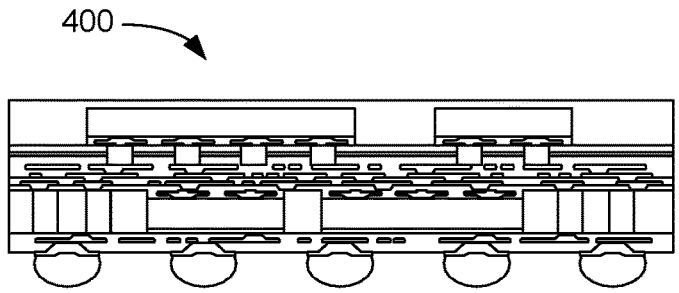

FIGS. 4A-C illustrates an exemplary partial method for manufacturing a package in accordance with some examples of the disclosure. As shown in FIG. 4A, a partial method for manufacturing a package 400 (e.g., package 100) may begin with providing a second portion 450 (e.g., second portion of FIG. 3I). As shown in FIG. 4B, the partial method may continue with mating a first portion 460 (e.g., first portion of FIG. 2M) to the second portion 450, such as by curing (e.g., at 150-250 degree Celsius) a first oxide layer 424 (e.g., oxide 224) and a second oxide layer 442 (e.g., second oxide 342) to create a covalent bond between the second portion 450 and the first portion 460 and metal to metal diffusion bonds between a first plurality of interconnections 430 and a second plurality of interconnections 440. As shown in FIG. 4C, the partial method may conclude with removing a second carrier 418 (e.g., second carrier 218) to form the package 400.

Figure 5:
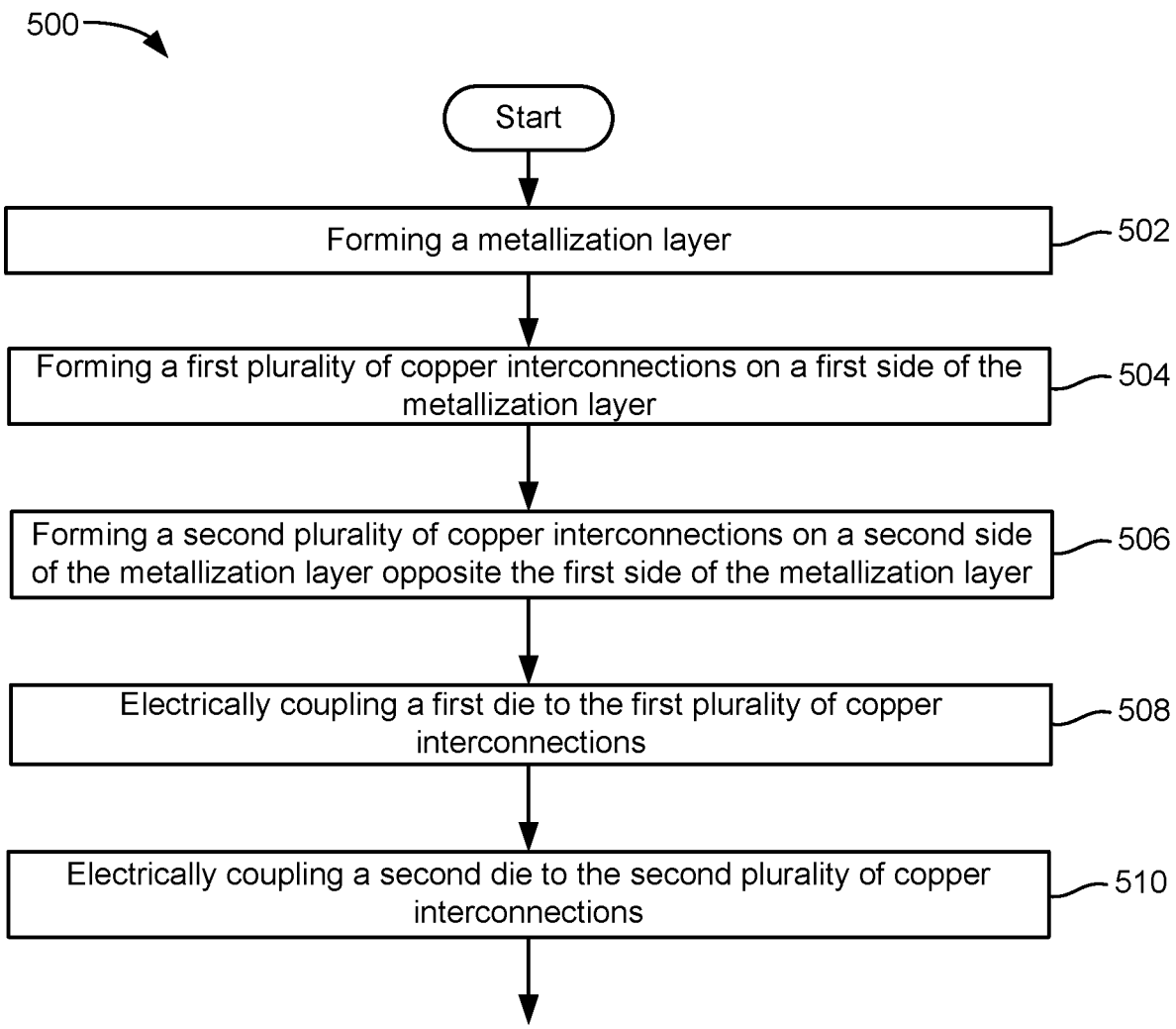
FIG. 5 illustrates another exemplary partial method for manufacturing a package in accordance with some examples of the disclosure.

FIG. 5 illustrates another exemplary partial method for manufacturing a package in accordance with some examples of the disclosure. As shown in FIG. 5, the partial method 500 may begin in block 502 with forming a metallization layer. The partial method 500 may continue in block 504 with forming a first plurality of copper interconnections on a first side of the metallization layer. The partial method 500 may continue in block 506 with forming a second plurality of copper interconnections on a second side of the metallization layer opposite the first side of the metallization layer. The partial method 500 may continue in block 508 with electrically coupling a first die to the first plurality of copper interconnections. The partial method 500 may conclude in block 510 with electrically coupling a second die to the second plurality of copper interconnections.

Alternatively, the partial method 500 may include forming a first metallization structure in the metallization layer wherein the first plurality of copper interconnections are connected to the first metallization structure; forming a second metallization structure in the metallization layer wherein the second plurality of copper interconnections are connected to the second metallization structure; wherein the first plurality of copper interconnections comprises at least one copper die bump and at least one copper pillar; wherein the at least one copper pillar comprises a pillar formed with a copper to copper diffusion bond; forming a dielectric layer between the first side of the metallization layer and the first die; wherein the dielectric layer comprises an oxide covalent bond; and incorporating the package into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

Figure 6:
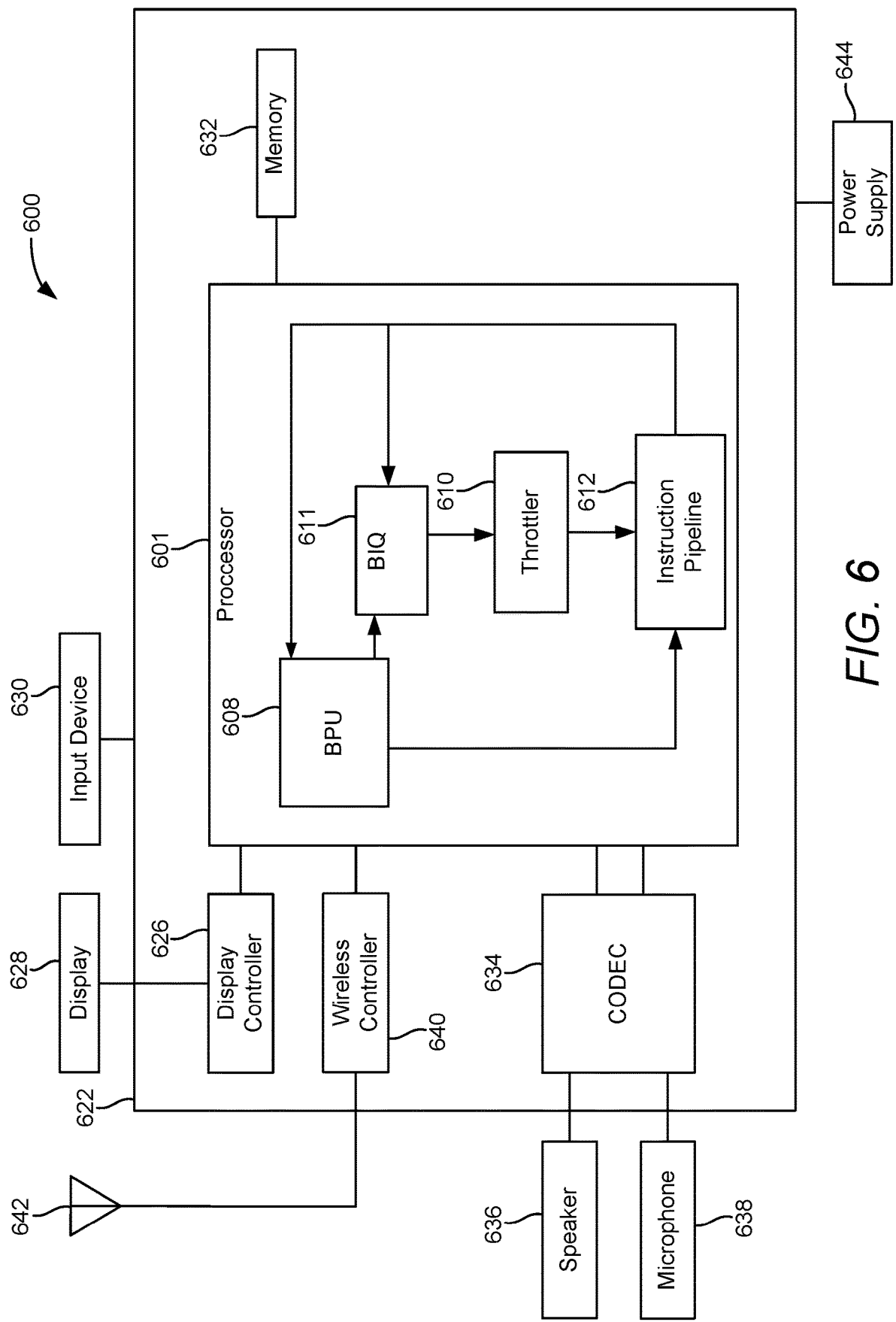
FIG. 6 illustrates an exemplary mobile device in accordance with some examples of the disclosure.

FIG. 6 illustrates an exemplary mobile device in accordance with some examples of the disclosure. Referring now to FIG. 6, a block diagram of a mobile device that is configured according to exemplary aspects is depicted and generally designated 600. In some aspects, mobile device 600 may be configured as a wireless communication device. As shown, mobile device 600 includes processor 601, which may be configured to implement the methods described herein in some aspects. Processor 601 is shown to comprise instruction pipeline 612, buffer processing unit (BPU) 608, branch instruction queue (BIQ) 611, and throttler 610 as is well known in the art. Other well-known details (e.g., counters, entries, confidence fields, weighted sum, comparator, etc.) of these blocks have been omitted from this view of processor 601 for the sake of clarity.

Processor 601 may be communicatively coupled to memory 632 over a link, which may be a die-to-die or chip-to-chip link. Mobile device 600 also include display 628 and display controller 626, with display controller 626 coupled to processor 601 and to display 628.

In some aspects, FIG. 6 may include coder/decoder (CODEC) 634 (e.g., an audio and/or voice CODEC) coupled to processor 601; speaker 636 and microphone 638 coupled to CODEC 634; and wireless controller 640 (which may include a modem) coupled to wireless antenna 642 and to processor 601.

In a particular aspect, where one or more of the above-mentioned blocks are present, processor 601, display controller 626, memory 632, CODEC 634, and wireless controller 640 can be included in a system-in-package or system-on-chip device 622. Input device 630 (e.g., physical or virtual keyboard), power supply 644 (e.g., battery), display 628, input device 630, speaker 636, microphone 638, wireless antenna 642, and power supply 644 may be external to system-on-chip device 622 and may be coupled to a component of system-on-chip device 622, such as an interface or a controller.

It should be noted that although FIG. 6 depicts a mobile device, processor 601 and memory 632 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 7:
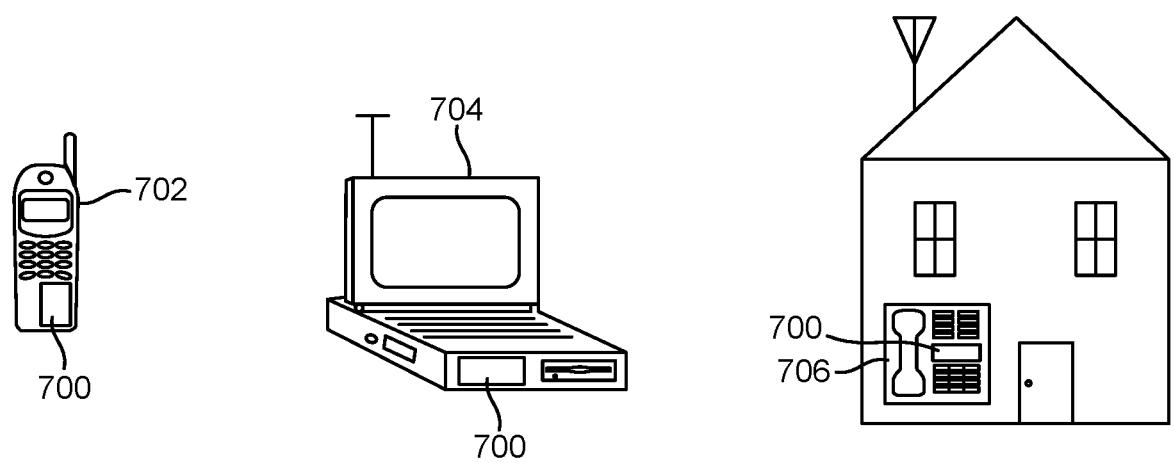
FIG. 7 illustrates various electronic devices that may be integrated with any of the aforementioned methods, devices, semiconductor devices, integrated circuits, die, interposers, packages, or package-on-packages (PoPs) in accordance with some examples of the disclosure.

FIG. 7 illustrates various electronic devices that may be integrated with any of the aforementioned packages in accordance with some examples of the disclosure. For example, a mobile phone device 702, a laptop computer device 704, and a fixed location terminal device 706 may include a package 700 as described herein. The package 700 may be, for example, any of the integrated circuits, dies, integrated devices, integrated device packages, integrated circuit devices, device packages, integrated circuit (IC) packages, package-on-package devices described herein. The devices 702, 704, 706 illustrated in FIG. 7 are merely exemplary. Other electronic devices may also feature the package 700 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. It should furthermore be noted that methods, systems, and apparatus disclosed in the description or in the claims can be implemented by a device comprising means for performing the respective actions of this method. For example, in one aspect, a package may comprise: a metallization layer; a first die on a first side of the metallization layer; a second die on a second side of the metallization layer opposite the first side of the metallization layer; first means for interconnection (e.g., a first plurality of copper interconnections) between the first die and the metallization layer; and second means for interconnection (e.g., a second plurality of copper interconnections) between the second die and the metallization layer. It will be appreciated that the aforementioned aspects are merely provided as examples and the various aspects claimed are not limited to the specific references and/or illustrations cited as examples.

One or more of the components, processes, features, and/or functions illustrated in FIGS. 1-7 may be rearranged and/or combined into a single component, process, feature or function or incorporated in several components, processes, or functions. Additional elements, components, processes, and/or functions may also be added without departing from the disclosure. It should also be noted that FIGS. 1-7 and its corresponding description in the present disclosure is not limited to dies and/or ICs. In some implementations, FIGS. 1-7 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer. An active side of a device, such as a die, is the part of the device that contains the active components of the device (e.g. transistors, resistors, capacitors, inductors etc.), which perform the operation or function of the device. The backside of a device is the side of the device opposite the active side.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5 (both expressly incorporated herein in their entirety).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or other such configurations). Additionally, these sequence of actions described herein can be considered to be incorporated entirely within any form of computer-readable storage medium (transitory and non-transitory) having stored therein a corresponding set of computer instructions that upon execution would cause an associated processor to perform the functionality described herein. Thus, the various aspects of the disclosure may be incorporated in a number of different forms, all of which have been contemplated to be within the scope of the claimed subject matter. In addition, for each of the examples described herein, the corresponding form of any such examples may be described herein as, for example, "logic configured to" perform the described action.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be incorporated directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art including non-transitory types of memory or storage mediums. An exemplary storage medium is coupled to the processor such that the processor can read information from, and write information to, the storage medium. In the alternative, the storage medium may be integral to the processor.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A package comprising:
    a metallization layer;
    a first die electrically coupled to a first side of the metallization layer;
    a second die electrically coupled to a second side of the metallization layer opposite the first side of the metallization layer, the second die being encapsulated by a mold compound on the second side of the metallization layer;
    a first plurality of copper interconnections between the first die and the metallization layer; and
    a second plurality of copper interconnections between the second die and the metallization layer, wherein one of the second plurality of copper interconnections is comprised of:
        a first copper portion and a second copper portion directly coupled together;
        the first copper portion coupled to the first side of the metallization layer and the second copper portion coupled to the second die;
    wherein electrical paths configured to couple the first plurality of copper interconnections with the second plurality of copper interconnections are solderless, and
    wherein the metallization layer is wider than the first die and wider than the second die.

2. The package of claim 1, further comprising a first metallization structure in the metallization layer wherein the first plurality of copper interconnections are connected to the first metallization structure.

3. The package of claim 2, further comprising a second metallization structure in the metallization layer wherein the second plurality of copper interconnections are connected to the second metallization structure.

4. The package of claim 3, wherein the first metallization structure is coupled to the second metallization structure.

5. The package of claim 3, wherein the first metallization structure is one of copper, silver, gold, or similar metals.

6. The package of claim 5, wherein the second metallization structure is one of copper, silver, gold, or similar metals.

7. The package of claim 1, wherein the first plurality of copper interconnections comprises at least one copper die bump and at least one copper pillar.

8. The package of claim 7, wherein the second plurality of copper interconnections comprises a pillar formed with a copper to copper diffusion bond.

9. The package of claim 7, further comprising a dielectric layer between the second die and the metallization layer.

10. The package of claim 9, wherein the dielectric layer comprises an oxide covalent bond.

11. The package of claim 1, wherein the package is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

12. A package comprising:
a metallization layer;
a first die electrically coupled to a first side of the metallization layer;
a second die electrically coupled to a second side of the metallization layer opposite the first side of the metallization layer, the second die being encapsulated by a mold compound on the second side of the metallization layer;
first means for interconnection between the first die and the metallization layer; and
second means for interconnection between the second die and the metallization layer, wherein one of the second means for interconnection is comprised of:
a first copper portion and a second copper portion directly coupled together;
the first copper portion coupled to the first side of the metallization layer and the second copper portion coupled to the second die;
wherein electrical paths configured to couple the first means with the second means are solderless, and
wherein the metallization layer is wider than the first die and wider than the second die.

13. The package of claim 12, further comprising a first metallization structure in the metallization layer wherein the first means for interconnection are connected to the first metallization structure.

14. The package of claim 13, further comprising a second metallization structure in the metallization layer wherein the second means for interconnection are connected to the second metallization structure.

15. The package of claim 14, wherein the first metallization structure is coupled to the second metallization structure.

16. The package of claim 14, wherein the first metallization structure is one of copper, silver, gold, or similar metals.

17. The package of claim 16, wherein the second metallization structure is one of copper, silver, gold, or similar metals.

18. The package of claim 12, wherein the first means for interconnection comprises at least one copper die bump and at least one copper pillar.

19. The package of claim 18, wherein the second plurality of copper interconnections comprises a pillar formed with a copper to copper diffusion bond.

20. The package of claim 18, further comprising a dielectric layer between the second die and the metallization layer.

21. The package of claim 20, wherein the dielectric layer comprises an oxide covalent bond.

22. The package of claim 12, wherein the package is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

23. A method for manufacturing a package, the method comprising:
forming a metallization layer;
forming a first plurality of copper interconnections on a first side of the metallization layer;
forming a second plurality of copper interconnections on a second side of the metallization layer opposite the first side of the metallization layer;
electrically coupling a first die to the first plurality of copper interconnections; and
electrically coupling a second die to the second plurality of copper interconnections, the second die being encapsulated by a mold compound on the second side of the metallization layer,
wherein electrical paths configured to couple the first plurality of copper interconnections with the second plurality of copper interconnections are solderless, and
wherein the metallization layer is wider than the first die and wider than the second die;
wherein one of the second plurality of copper interconnections is comprised of:
a first copper portion and a second copper portion directly coupled together;
the first copper portion coupled to the first side of the metallization layer and the second copper portion coupled to the second die.

24. The method of claim 23, further comprising forming a first metallization structure in the metallization layer wherein the first plurality of copper interconnections are connected to the first metallization structure.

25. The method of claim 23, further comprising forming a second metallization structure in the metallization layer wherein the second plurality of copper interconnections are connected to the second metallization structure.

26. The method of claim 23, wherein the first plurality of copper interconnections comprises at least one copper die bump and at least one copper pillar.

27. The method of claim 23, wherein the second plurality of copper interconnections comprises a pillar formed with a copper to copper diffusion bond.

28. The method of claim 23, further comprising forming a dielectric layer between the second die and the metallization layer.

29. The method of claim 28, wherein the dielectric layer comprises an oxide covalent bond.

30. The method of claim 23, further comprising incorporating the package into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

* * * * *